United States Patent
Baik (10) Patent No.: US 9,913,391 B2
(45) Date of Patent: Mar. 6, 2018

(54) ELECTRONIC COMPONENT CASE

(71) Applicant: LG INNOTEK CO., LTD., Seoul (KR)

(72) Inventor: Ji Hyeon Baik, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 15/297,919

(22) Filed: Oct. 19, 2016

(65) Prior Publication Data

US 2017/0112013 A1    Apr. 20, 2017

(30) Foreign Application Priority Data

Oct. 20, 2015  (KR) .................. 10-2015-0146236

(51) Int. Cl.
| | |
|---|---|
| H05K 7/14 | (2006.01) |
| H05K 7/12 | (2006.01) |
| H01F 27/26 | (2006.01) |

(52) U.S. Cl.
CPC ............. *H05K 7/12* (2013.01); *H01F 27/266* (2013.01)

(58) Field of Classification Search
CPC .................................. H05K 7/12; H01F 27/266
See application file for complete search history.

(56) References Cited

U.S. PATENT DOCUMENTS

| | | | | |
|---|---|---|---|---|
| 3,208,020 A | * | 9/1965 | Gagnon | H01F 27/02 174/541 |
| 3,662,308 A | * | 5/1972 | Muschong | H01F 27/25 336/210 |
| 5,289,153 A | * | 2/1994 | Gross | H01F 27/266 336/210 |
| 5,920,249 A | * | 7/1999 | Huss | H01F 41/00 336/197 |
| 9,177,711 B2 | * | 11/2015 | Lee | H01F 27/22 |
| 9,538,674 B2 | * | 1/2017 | Kushima | H02K 5/24 |
| 9,583,253 B2 | * | 2/2017 | Islinger | H01F 27/266 |
| 9,589,717 B2 | * | 3/2017 | Suzuki | B29C 70/68 |
| 2013/0106551 A1 | * | 5/2013 | Goto | H01F 27/06 336/170 |
| 2013/0170113 A1 | * | 7/2013 | Ikezawa | H05K 7/00 361/679.01 |
| 2016/0230800 A1 | * | 8/2016 | Sawai | H01R 4/34 |
| 2017/0158144 A1 | * | 6/2017 | Wilckens | B60R 11/00 |

* cited by examiner

*Primary Examiner* — Hung V Ngo
(74) *Attorney, Agent, or Firm* — Birch, Stewart, Kolasch & Birch, LLP (57) ABSTRACT

Disclosed is an electronic component case which includes a case body in which a rotationally engaging boss and a rotation prevention protrusion are disposed; and a bracket having a bracket body and an engaging portion formed at an end portion of the bracket body, wherein the engaging portion includes a rotationally engaging hole aligned with the rotationally engaging boss and a rotation prevention portion formed to be spaced apart from the rotationally engaging hole to form a contacting surface that is caught by the rotation prevention protrusion, and provides an advantageous effect of preventing the bracket from rotating in a process of tightening a screw to the bracket.

10 Claims, 9 Drawing Sheets

ELECTRONIC COMPONENT CASE

CROSS-REFERENCE TO RELATED APPLICATION

This application claims priority to and the benefit of Korean Patent Application No. 2015-0146236, filed on Oct. 20, 2015, the disclosure of which is incorporated herein by reference in its entirety.

BACKGROUND

1. Field of the Invention

The present invention relates to an electronic component case, and more particularly, to an electronic component case to which an electronic component is fixed using a bracket.

2. Discussion of Related Art

An electronic component case is an apparatus which separates outside space and a component accommodation space to protect an electronic component accommodated therein. An electronic component may be coupled to an inside of an electronic component case using a bracket.

Generally, a bracket in an electronic component case is provided with a configuration that is in contact with an electronic component or accommodates the electronic component, and an engaging configuration for engaging the electronic component with the electronic component case. An engaging boss having an engaging hole may be formed at the electronic component case and an engaging hole corresponding to the engaging boss may be formed as an engaging configuration of the bracket.

A screw, which is a widely used engaging member, couples the electronic component case and the bracket by passing through the engaging hole and rotationally engaging with the engaging boss to couple the bracket to the electronic component case.

Generally, to fix an electronic component to an electronic component case, first, an engaging process is performed at an engaging hole of any one end portion of opposite end portions of a bracket. However, when a screw is engaged with any one end portion of the opposite end portions of the bracket, there is a large risk of the bracket moving during the engaging process. This is because the bracket is easily rotated when the screw is rotated at one end portion of the bracket since the other end portion of the bracket is not in a fixed state.

When the bracket rotatably moves during an assembling process, a problem arises in that the bracket comes into contact with other components adjacent to the bracket. When the bracket comes into contact with the other components, there is a high possibility of damaging the components that are in contact with the bracket. When it is considered that electronic components are densely populated inside an electronic component case, a rotation of the bracket may cause a negative influence on a performance of a product.

SUMMARY OF THE INVENTION

The present invention is directed to providing an electronic component case which prevents a bracket from rotating in conjunction with a process of rotationally engaging the bracket.

The technical objectives of the present invention are not limited to the above objective, and other objectives may become apparent to those of ordinary skill in the art based on the following descriptions.

According to an aspect of the present invention, there is provided an electronic component case including: a case body in which a rotationally engaging boss and a rotation prevention protrusion are disposed; and a bracket having a bracket body and an engaging portion formed at an end portion of the bracket body, wherein the engaging portion includes a rotationally engaging hole aligned with the rotationally engaging boss and a rotation prevention portion formed to be spaced apart from the rotationally engaging hole to form a contacting surface that is caught by the rotation prevention protrusion.

The engaging portion may include a first engaging flange formed at one end portion of the bracket body and having the rotationally engaging hole and the rotation prevention portion, and a second engaging flange formed at the other end portion of the bracket body and having the rotationally engaging hole and the rotation prevention portion.

The contacting surface of the rotation prevention portion may be a curved surface.

The rotation prevention portion may be formed as a hole which forms the contacting surface.

A center of the rotation prevention portion may be disposed on a reference line formed to be perpendicular to a length direction of the bracket body and passing through a center of the rotationally engaging hole.

The bracket body may be formed to be bent to form an accommodation space in which an electronic component is accommodated.

The bracket body may include side surfaces formed to be perpendicularly bent from the first engaging flange and the second engaging flange, an upper surface, and bent portions formed to be bent from the side surfaces toward the upper surface to be connected to the upper surface.

With respect to a virtual reference line which connects a center of the rotationally engaging hole of the first engaging flange and a center of the rotationally engaging hole of the second engaging flange, the rotation prevention portion of the first engaging flange may be disposed at one side of the reference line and the rotation prevention portion of the second engaging flange may be disposed at the other side of the reference line.

The engaging portion may include an extending portion which protrudes in a width direction of the bracket body and at least a portion of the rotation prevention portion may be disposed at the extending portion.

The bracket body may include side surfaces formed to be perpendicularly bent from the engaging portion, an upper surface, and bent portions formed to be bent from the side surfaces toward the upper surface to be connected to the upper surface.

BRIEF DESCRIPTION OF THE DRAWINGS

The above and other objects, features and advantages of the present invention will become more apparent to those of ordinary skill in the art by describing exemplary embodiments thereof in detail with reference to the accompanying drawings, in which.

DETAILED DESCRIPTION OF EXEMPLARY EMBODIMENTS

Hereinafter, exemplary embodiments of the present invention will be described in detail with reference to the accompanying drawings. Objectives, advantages and new features of the present invention will become more apparent by referencing the following detailed description and exemplary embodiments associated with the accompanying drawings. And, terminology and words used in this specification including the claims are not limited by their normal or lexical meanings. Based on the principle that an inventor can appropriately define terminology for explaining the invention in the best way possible, the terminology should be interpreted as having meanings and concepts according to the aspects of the inventive concept. In the description, detailed descriptions of well-known technologies related to the present invention will be omitted when they may unnecessarily obscure the subject matter of the invention.

Figure 1:
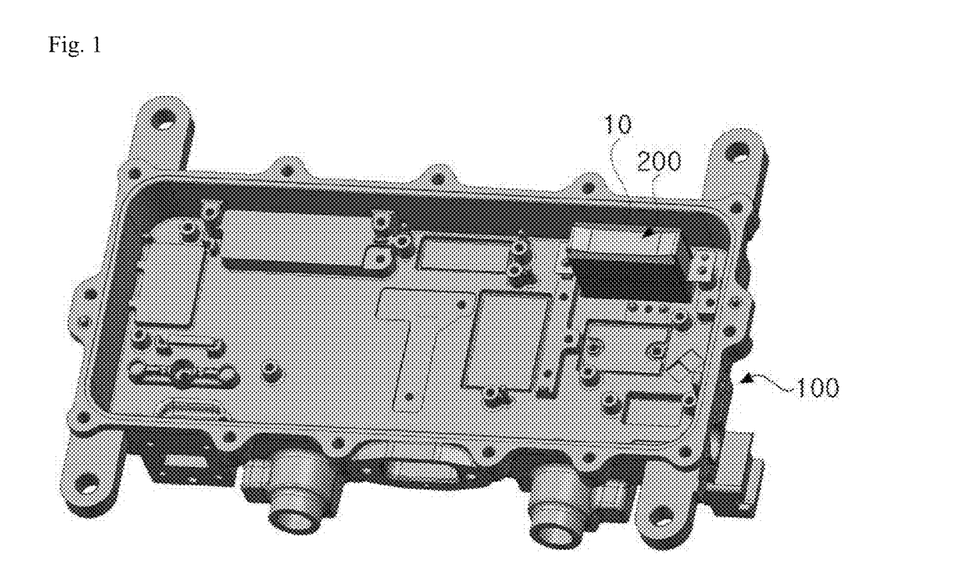
FIG. 1 is a view illustrating an electronic component case according to one exemplary embodiment of the present invention.
Figure 2:
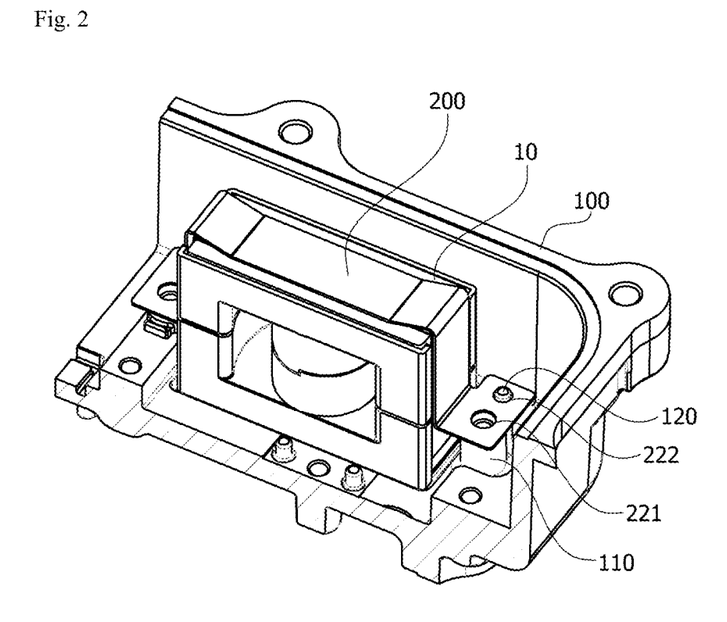
FIG. 2 is a view illustrating a bracket coupled to a case body.
Figure 3:
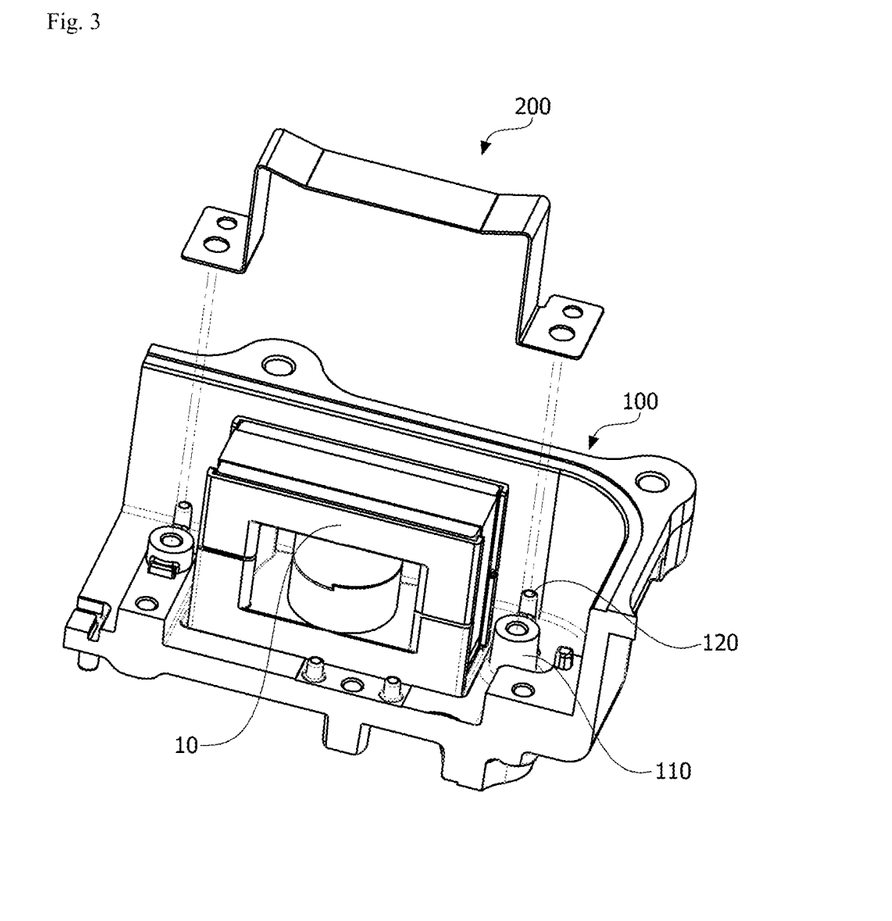
FIG. 3 is an exploded view illustrating a case body and a bracket.

FIG. 1 is a view illustrating an electronic component case according to one exemplary embodiment of the present invention, FIG. 2 is a view illustrating a bracket coupled to a case body, and FIG. 3 is an exploded view illustrating a case body and a bracket.

An electronic component case according to one exemplary embodiment of the present invention may include a case body 100 and a bracket 200.

The case body 100 may be provided with an internal space which accommodates electronic components (for example, components which form a converter) and a configuration for fixing the electronic components. As the configuration for fixing the electronic components, the case body 100 may include a rotationally engaging boss 110 and a rotation prevention protrusion 120.

The rotationally engaging boss 110 is formed to protrude from the case body 100 to which an engaging member such as a screw is rotationally coupled. The rotationally engaging boss 110 may be positioned corresponding to positions of electronic components being installed in the case body 100. Here, a plurality of rotationally engaging bosses 110 may be installed to be separated from each other in consideration of lengths and widths of electronic components to be installed.

The rotation prevention protrusion 120 may be formed around the rotationally engaging boss 110. The rotation prevention protrusion 120 is formed to protrude from a bottom surface of the case body 100 to serve the role of preventing the bracket 200 from rotating.

Figure 4:
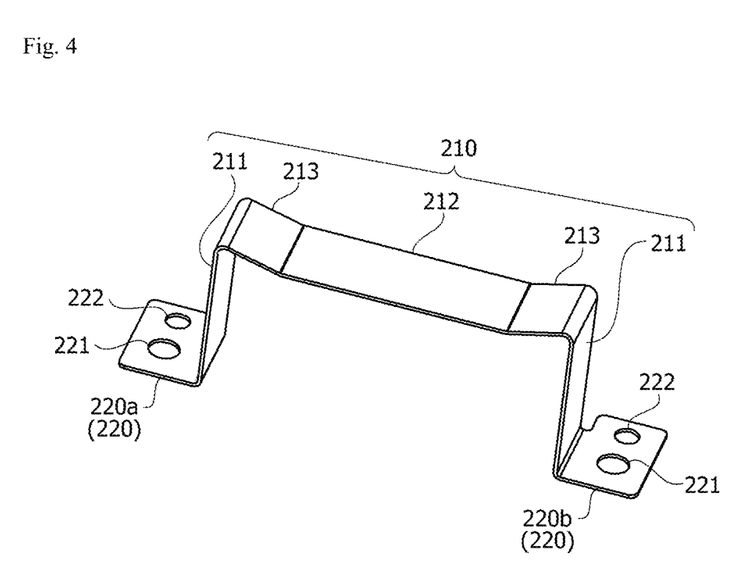
FIG. 4 is a view illustrating a bracket of an electronic component case according to one exemplary embodiment of the present invention.

FIG. 4 is a view illustrating a bracket of an electronic component case according to one exemplary embodiment of the present invention.

Referring to FIGS. 2 to 4, the bracket 200 serves the role of fixing an electronic component 10 to the case body 100. Such a bracket 200 may include a bracket body 210 and an engaging portion 220.

The bracket body 210 serves the role of fixing the electronic component 10 to the case body 100 in a state in which the bracket body 210 presses and fixes the electronic component 10 which is accommodated by or in contact with the bracket body 210. Although the bracket body 210 is illustrated as a band shape in FIG. 4, the present invention is not limited thereto and may be implemented in various modified shapes corresponding to a shape of the electronic component 10.

Such a bracket body 210 may include side surfaces 211, an upper surface 212, and bent portions 213, which form an accommodating space therein for accommodating the electronic component 10.

The bracket body 210 may form the accommodating space in which the electronic component 10 is positioned by a configuration in which opposite ends of the upper surface 212 are connected with each of the side surfaces 211 via the bent portions 213 formed to be bent from one end of the side surface 211 toward the upper surface 212. At least one of the upper surface 212 and the side surface 211 may be formed to be in contact with the electronic component 10. The upper surface 212 may be configured to elastically press the electronic component 10 in contact with the upper surface 212 because the upper surface 212 is formed to be lowered by the bent portion 213.

The engaging portion 220 may include a first engaging flange 220a and a second engaging flange 220b. The first engaging flange 220a may be formed to be perpendicularly bent from the side surface 211 connected to one side of the upper surface 212. In addition, the second engaging flange 220b may be formed to be perpendicularly bent from the side surface 211 connected to the other side of the upper surface 212.

A rotationally engaging hole 221 and a rotation prevention portion 222 may be formed at each of the first engaging flange 220a and the second engaging flange 220b.

The rotationally engaging hole 221 is a place into which a rotationally engaging member such as a screw is inserted. The rotation prevention portion 222 is disposed to be spaced apart from the rotationally engaging hole 221 to form a contacting surface. Here, the contacting surface refers to a portion which comes into contact with the rotation prevention protrusion 120 formed at the case body 100 to prevent the bracket 200 from rotating in a state in which the engaging portion 220 is in contact with the rotationally engaging boss 110 of the case body 100.

As an example, the contacting surface of the rotation prevention portion 222 may be formed as a curved surface and may also be implemented in a shape of hole such as a rotation prevention portion as illustrated in FIG. 4.

Figure 5:
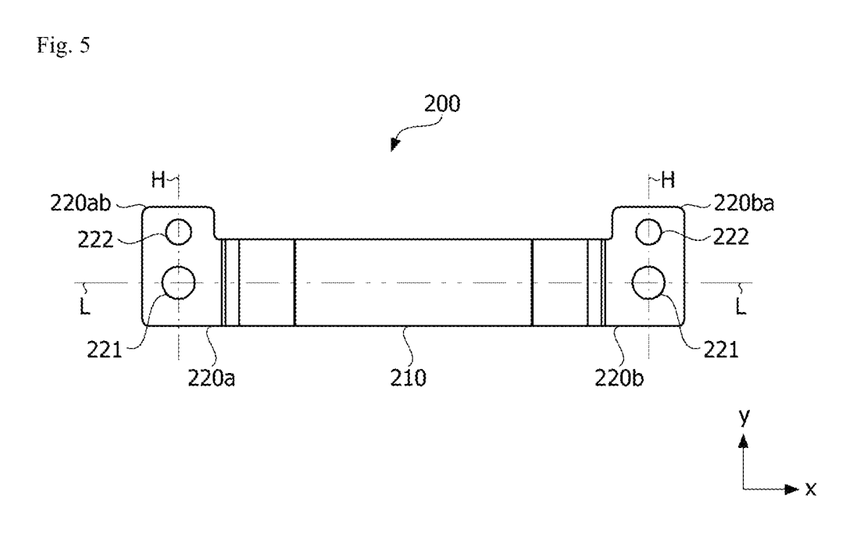
FIG. 5 is a view illustrating positions of a rotationally engaging hole and a rotation prevention portion.

FIG. 5 is a view illustrating positions of a rotationally engaging hole and a rotation prevention portion.

Referring to FIG. 5, the rotation prevention portion 222 and the rotationally engaging hole 221 are disposed to be spaced apart from each other.

Specifically, a virtual reference line L which passes through a center of the rotationally engaging hole 221 of the first engaging flange 220a and a center of the rotationally engaging hole 221 of the second engaging flange 220b may be formed to be parallel with a length direction of the bracket body 210 (an x-axis direction of FIG. 5).

The rotation prevention portion 222 may be disposed on a reference line H formed to be perpendicular to the reference line L. When the rotation prevention portion 222 is formed as a hole, the rotation prevention portion 222 may be formed so that a center of the hole is disposed on the reference line H.

Meanwhile, the first engaging flange 220a and the second engaging flange 220b may respectively include extending portions 220ab and 220ba which protrude from the level of the bracket body 210 in a width direction (a y-axis direction) of the bracket body 210. Here, at least a portion of the rotation prevention portion 222 may be disposed at the extending portions 220ab and 220ba.

Figure 6:
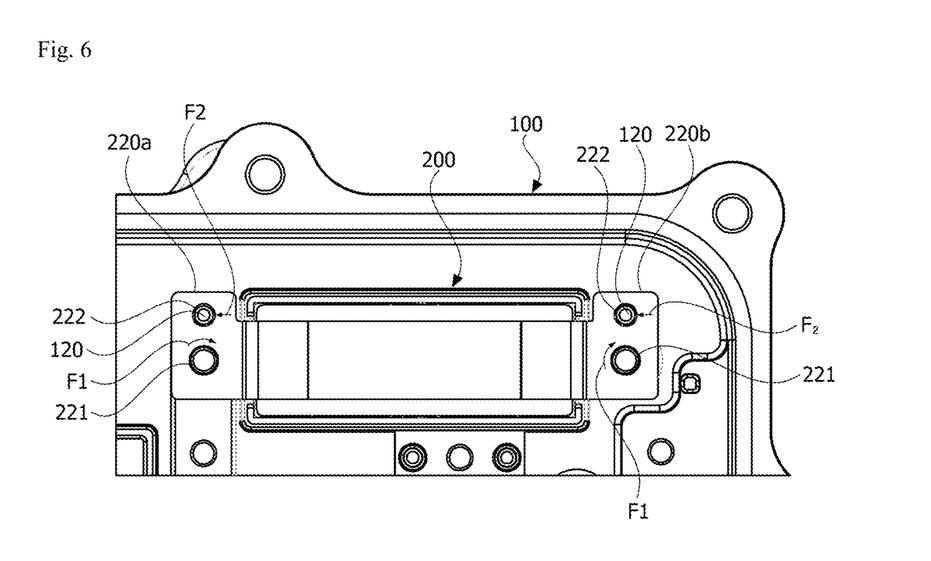
FIG. 6 is a view illustrating a state in which a rotation prevention portion prevents a bracket from rotating.

FIG. 6 is a view illustrating a state in which a rotation prevention portion prevents a bracket from rotating.

Referring to FIG. 6, when an engaging screw is rotated to be engaged with the rotationally engaging hole 221, a force, such as F1 of FIG. 6, due to a frictional force between the engaging screw and the bracket 200 generated while the engaging screw is tightened may cause the bracket 200 to rotate about the rotationally engaging hole 221. Here, a reaction force (F2 of FIG. 6) works because the rotation prevention protrusion 120 is stuck in the hole shaped rotation prevention portion 222, and thereby rotation of the bracket 200 is prevented.

Figure 7:
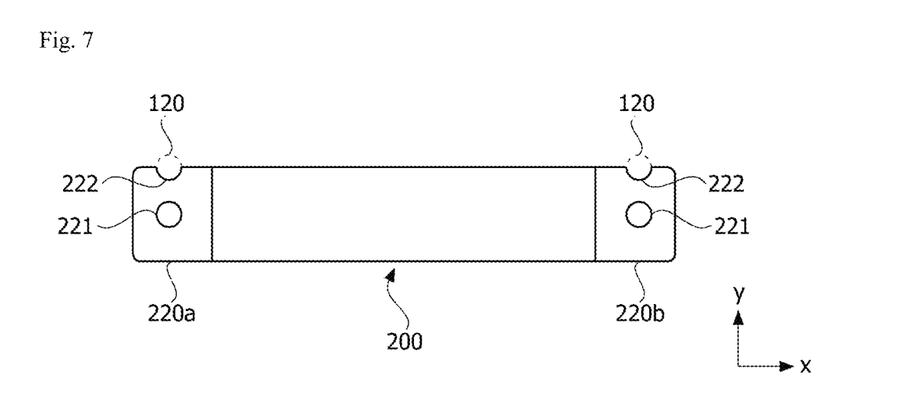
FIG. 7 is a view illustrating a first modified example of a rotation prevention portion.

FIG. 7 is a view illustrating a first modified example of a rotation prevention portion.

Referring to FIG. 7, the rotation prevention portion 222 may be formed to have a contacting surface in the shape of a curved surface which is a semicircular shape. Here, the rotation prevention portion 222 may be implemented as a shape that is open in a width direction of the bracket body 210 (the y-axis direction of FIG. 7).

Figure 8:
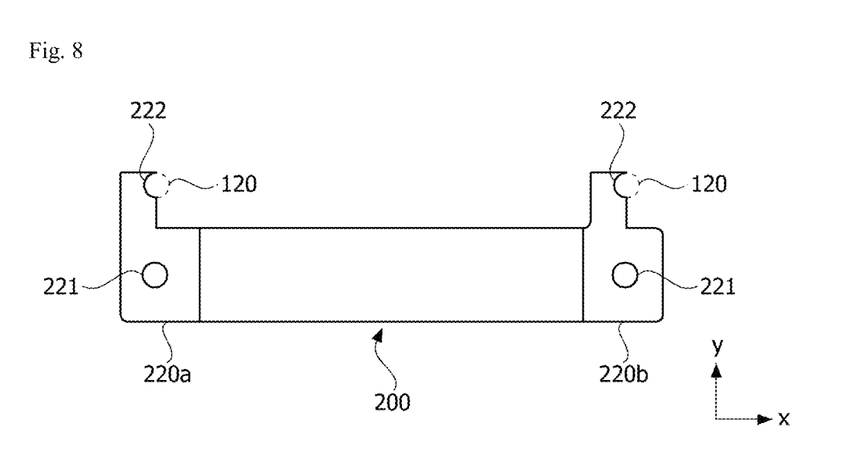
FIG. 8 is a view illustrating a second modified example of a rotation prevention portion.

FIG. 8 is a view illustrating a second modified example of a rotation prevention portion.

Referring to FIG. 8, the rotation prevention portion 222 may be formed to have a contacting surface in the shape of a curved surface which is a semicircular shape, and the rotation prevention portion 222 may be implemented as a shape that is open in the length direction of the bracket body 210 (the x-axis direction of FIG. 8).

Figure 9:
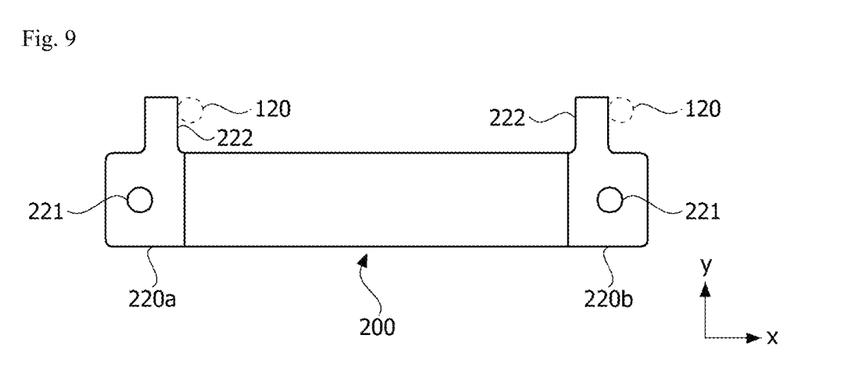
FIG. 9 is a view illustrating a third modified example of a rotation prevention portion.

FIG. 9 is a view illustrating a third modified example of a rotation prevention portion.

Referring to FIG. 9, the rotation prevention portion 222 may be formed to have a contacting surface in a planar shape. The rotation prevention portion 222 may be formed to protrude from each of the first engaging flange 220a and the second engaging flange 220b to form contacting surfaces in planar shapes which come into contact with the rotation prevention protrusion 120.

The electronic component case according to one exemplary embodiment of the present invention has been described with reference to the accompanying drawings.

According to one embodiment of the present invention, the bracket of the electronic component case includes the rotation prevention portion disposed to be spaced apart from the rotationally engaging hole and the contacting surface caught by the rotation prevention protrusion so that an advantageous effect of preventing the bracket from rotating during a process of tightening a screw to the bracket is provided.

The above description of embodiments is merely for describing technical sprit of the present invention, and those having ordinary skill in the art should understand that various changes, modifications, and replacements may be made therein without departing from the spirit and features of the present invention. Accordingly, the above described embodiments of the present invention and the accompanying drawings should be considered in a descriptive sense only and not in a limitative sense. The scope of the concept of the present invention is not limited by the above-described embodiments and the accompanying drawings. The scope of the present invention should be interpreted only according to the attached claims, and it should be understood that all technical ideas within an equivalent scope thereof should be interpreted as being included in the scope of the present invention.

REFERENCE NUMERALS

100: CASE BODY
110: ROTATIONALLY ENGAGING BOSS
120: ROTATION PREVENTION PROTRUSION
200: BRACKET
210: BRACKET BODY
211: SIDE SURFACE
212: UPPER SURFACE
213: BENT PORTION
220: ENGAGING PORTION
220A: FIRST ENGAGING FLANGE
220B: SECOND ENGAGING FLANGE
221: ROTATIONALLY ENGAGING HOLE
222: ROTATION PREVENTION PORTION

What is claimed is:

1. An electronic component case comprising:
   a case body in which a rotationally engaging boss and a rotation prevention protrusion are disposed; and
   a bracket including a bracket body and an engaging portion formed at an end portion of the bracket body,
   wherein the rotationally engaging boss and the rotation prevention protrusion are formed at the top of the case body while protruding upward,
   wherein the engaging portion includes a rotationally engaging hole in which the rotationally engaging boss is disposed and a rotation prevention portion formed to be spaced apart from the rotationally engaging hole,
   wherein the bracket body includes an upper surface, side surfaces, one of which is disposed at one end portion of the upper surface, and the other at the other end portion of the upper surface, and bent portions which connect the upper surface and the side surfaces, thereby forming an accommodation space in an inner part of the bracket body,
   wherein the engaging portion includes a first engaging flange and a second engaging flange,
   wherein the first engaging flange is formed to be bent perpendicularly to the side surface extending from the one end portion of the upper surface,
   wherein the second engaging flange is formed to be bent perpendicularly to the side surface extending from the other end portion of the upper surface, and
   wherein the first engaging flange and the second engaging flange include the rotationally engaging hole and the rotation prevention portion, respectively.

2. The electronic component case of claim 1, wherein the rotation prevention portion is formed as a hole which forms the contacting surface.

3. The electronic component case of claim 1, wherein the angles formed between the upper surface and the bent portions of the bracket body are obtuse, and the angles formed between the bent portions and the side surfaces of the bracket body are acute.

4. The electronic component case of claim 1, wherein the rotation prevention portion includes a contacting surface which comes in contact with the rotation prevention protrusion and is in a curved shape.

5. The electronic component case of claim 1, wherein a reference line which connects a center of the rotationally engaging hole of the first engaging flange and a center of the rotationally engaging hole of the second engaging flange is parallel to a reference line which connects a center of the rotation prevention portion of the first engaging flange and a center of the rotation prevention portion of the second engaging flange.

6. The electronic component case of claim 5, wherein the reference line which connects the center of the rotationally engaging hole of the first engaging flange and the center of the rotationally engaging hole of the second engaging flange is perpendicular to a reference line which connects the center of the rotation prevention portion of the first engaging flange and the center of the rotationally engaging hole of the first engaging flange.

7. The electronic component case of claim 6, wherein, with respect to the reference line which connects the center of the rotationally engaging hole of the first engaging flange and the center of the rotationally engaging hole of the second engaging flange, the rotation prevention portion of the first engaging flange is disposed at one side of the reference line and the rotation prevention portion of the second engaging flange is disposed at the other side of the reference line.

8. The electronic component case of claim 1, wherein a height of the rotation prevention protrusion in the case body is greater than the height of the rotationally engaging boss in the case body.

9. The electronic component case of claim 8, wherein the upper surface of the rotationally engaging boss in the case body is in contact with the bottom supper surface of the engaging portion, and the rotation prevention protrusion in the case body penetrates through the engaging portion, thereby being exposed upward.

10. The electronic component case of claim 1, wherein the engaging portion includes an extending portion which protrudes in a width direction of the bracket body, at least a portion of the rotationally engaging hole is disposed at the extending portion, and the width of the upper surface, the width of the bent portions, and the width of the side surfaces are less than the width of an electronic component accommodated in the accommodation space.

* * * * *